(12) United States Patent
Lin et al.

(10) Patent No.: US 9,871,135 B2
(45) Date of Patent: Jan. 16, 2018

(54) SEMICONDUCTOR DEVICE AND METHOD OF MAKING

(71) Applicant: FREESCALE SEMICONDUCTOR, INC., Austin, TX (US)

(72) Inventors: Xin Lin, Phoenix, AZ (US); Hongning Yang, Chandler, AZ (US); Ronghua Zhu, Chandler, AZ (US); Jiang-Kai Zuo, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/171,047

(22) Filed: Jun. 2, 2016

(65) Prior Publication Data

US 2017/0352756 A1    Dec. 7, 2017

(51) Int. Cl.

| H01L 29/78 | (2006.01) |
|---|---|
| H01L 29/06 | (2006.01) |
| H01L 29/08 | (2006.01) |
| H01L 29/66 | (2006.01) |
| H01L 21/285 | (2006.01) |
| H01L 21/265 | (2006.01) |

(52) U.S. Cl.
CPC .... *H01L 29/7823* (2013.01); *H01L 21/26513* (2013.01); *H01L 21/28518* (2013.01); *H01L 29/0623* (2013.01); *H01L 29/0653* (2013.01); *H01L 29/0696* (2013.01); *H01L 29/086* (2013.01); *H01L 29/0878* (2013.01); *H01L 29/66681* (2013.01)

(58) Field of Classification Search
CPC ............. H01L 29/7823; H01L 29/0623; H01L 29/0653; H01L 29/0696; H01L 21/26513; H01L 29/0878; H01L 29/66681; H01L 21/28518; H01L 29/086

USPC ........................................................ 257/339
See application file for complete search history.

(56) References Cited

U.S. PATENT DOCUMENTS

| 5,216,275 A | 6/1993 | Chen |
| 5,386,136 A | 1/1995 | Williams et al. |
| 5,438,215 A | 8/1995 | Tihanyi |
| 5,923,071 A | 7/1999 | Saito |
| 5,932,897 A | 8/1999 | Kawaguchi et al. |
| 6,137,140 A | 10/2000 | Efland et al. |
| 6,211,552 B1 | 4/2001 | Efland et al. |

(Continued)

OTHER PUBLICATIONS

U.S. Appl. No. 15/340,848, Inventor Hongning Yang, "Semiconductor Device with Enhances 3D RESURF" filed Nov. 1, 2016, Office Action—Notice of Allowance, dated Mar. 27, 2017.

(Continued)

*Primary Examiner* — Caleen Sullivan

(57) ABSTRACT

A semiconductor device is disclosed that includes a first region of a first conductivity type that includes a drain, a region of a second conductivity type abutting the first region in a lateral direction and a vertical direction to form an interface between the first conductivity type and the second conductivity type, wherein the drain region is spaced apart from the interface. A source region of the first conductivity type abuts the second region in the lateral direction and vertical directions. A control gate structure includes a conductive layer that is spaced apart from the drain region by a first dimension in the lateral direction. A shallow trench isolation (STI) region having a second dimension in the lateral direction is disposed at a location of the first region between the source and drain regions, wherein the second dimension is less than one-half of the first dimension.

9 Claims, 8 Drawing Sheets

(56) References Cited

U.S. PATENT DOCUMENTS

| | | |
|---|---|---|
| 6,552,390 B2 | 4/2003 | Kameda |
| 6,882,023 B2 | 4/2005 | Khemka et al. |
| 7,282,765 B2 | 10/2007 | Xu et al. |
| 7,466,006 B2 | 12/2008 | Khemka et al. |
| 7,473,978 B2 | 1/2009 | Matsudai et al. |
| 7,511,319 B2 | 3/2009 | Zhu et al. |
| 7,535,058 B2 | 5/2009 | Liu et al. |
| 7,569,884 B2 | 8/2009 | Lee |
| 7,977,715 B2 | 7/2011 | Cai |
| 8,039,902 B2 | 10/2011 | Kim et al. |
| 8,159,029 B2 | 4/2012 | Su et al. |
| 8,193,585 B2 | 6/2012 | Grote et al. |
| 8,269,275 B2 | 9/2012 | Chen et al. |
| 8,282,722 B2 | 10/2012 | Vonwiller et al. |
| 8,304,831 B2 | 11/2012 | Zhu et al. |
| 8,330,220 B2 | 12/2012 | Khan et al. |
| 8,350,327 B2 | 1/2013 | Chung et al. |
| 8,716,791 B1 | 5/2014 | Iravani et al. |
| 8,809,952 B2 | 8/2014 | Landgraf et al. |
| 8,853,780 B2 | 10/2014 | Yang et al. |
| 9,136,323 B2 | 9/2015 | Yang et al. |
| 2001/0025961 A1 | 10/2001 | Nakamura et al. |
| 2001/0038125 A1 | 11/2001 | Ohyanagi et al. |
| 2002/0017697 A1 | 2/2002 | Kitamura et al. |
| 2006/0267044 A1 | 11/2006 | Yang |
| 2007/0246771 A1 | 10/2007 | McCormack et al. |
| 2007/0278568 A1 | 12/2007 | Williams et al. |
| 2008/0020813 A1 | 1/2008 | Choi et al. |
| 2008/0054994 A1 | 3/2008 | Shibib et al. |
| 2008/0067615 A1 | 3/2008 | Kim |
| 2008/0090347 A1 | 4/2008 | Huang |
| 2008/0191277 A1 | 8/2008 | Disney et al. |
| 2008/0246086 A1 | 10/2008 | Korec et al. |
| 2009/0020813 A1 | 1/2009 | Voldman |
| 2011/0127607 A1 | 6/2011 | Cai |
| 2011/0260247 A1 | 10/2011 | Yang et al. |
| 2012/0126323 A1 | 5/2012 | Wu et al. |
| 2012/0126324 A1 | 5/2012 | Takeda et al. |
| 2012/0161233 A1 | 6/2012 | Ito |
| 2012/0205738 A1 | 8/2012 | Yang et al. |
| 2013/0015523 A1 | 1/2013 | You |
| 2014/0203358 A1 | 7/2014 | Yang et al. |
| 2014/0264588 A1 | 9/2014 | Chen et al. |

OTHER PUBLICATIONS

Notice of Allowance dated Jun. 6, 2014 for U.S. Appl. No. 13/465,761, 9 pages.

Non-Final Office Action dated Jan. 30, 2014 for U.S. Appl. No. 13/465,761, 18 pages.

Final Office Action dated Oct. 25, 2013 for U.S. Appl. No. 13/465,761, 15 pages.

Non-Final Office Action dated Jun. 27, 2013 for U.S. Appl. No. 13/465,761, 16 pages.

Restriction Requirement dated Apr. 29, 2013 for U.S. Appl. No. 13/465,761, 7 pages.

Notice of Allowance dated May 13, 2015 for U.S. Appl. No. 14/486,104, 10 pages.

Ex parte Quayle Action dated Jan. 21, 2016 for U.S. Appl. No. 13/748,076, 4 pages.

Final Office Action dated Jul. 16, 2015 for U.S. Appl. No. 13/748,076, 5 pages.

Non-Final Office Action dated Dec. 26, 2014 for U.S. Appl. No. 13/748,076, 10 pages.

Notice of Allowance dated Apr. 12, 2016 for U.S. Appl. No. 13/748,076, 7 pages.

Fujihira, T. et al., "Simulated Superior Performances of Semiconductor Superjunction Devices," hoc. of the ISPSD, dated Jun. 1998; pp. 423-426.

Lorenz, L. et al. "COOLMOS—A New Milestone in High Voltage Power MOS," published at ISPSD, 1999; 8 pages.

Merchant, et al., "Dependence of breakdown voltage on drift length and buried oxide thickness in SOI RESURF LDMOS transistors", Proceedings of the 5th International Symposium on Power Semiconductor Devices and ICs, IEEE, 1993, pp. 124-128, ISBN 0-7803-1313-5.

Parthasarathy, V. et al., "A Double RESURF LDMOS with Drain Profile Engineering for Improved ESD Robustness," IEEE Electron Device Letter, vol. 23, No. 4, pp. 212-214 (2002).

Zhu, R. et al., "Engineering RESURF LDMOSFETs for Robust SOA, ESD Protection and Energy Capability," 19.sup.th ISPSD, pp. 185-188 (2007).

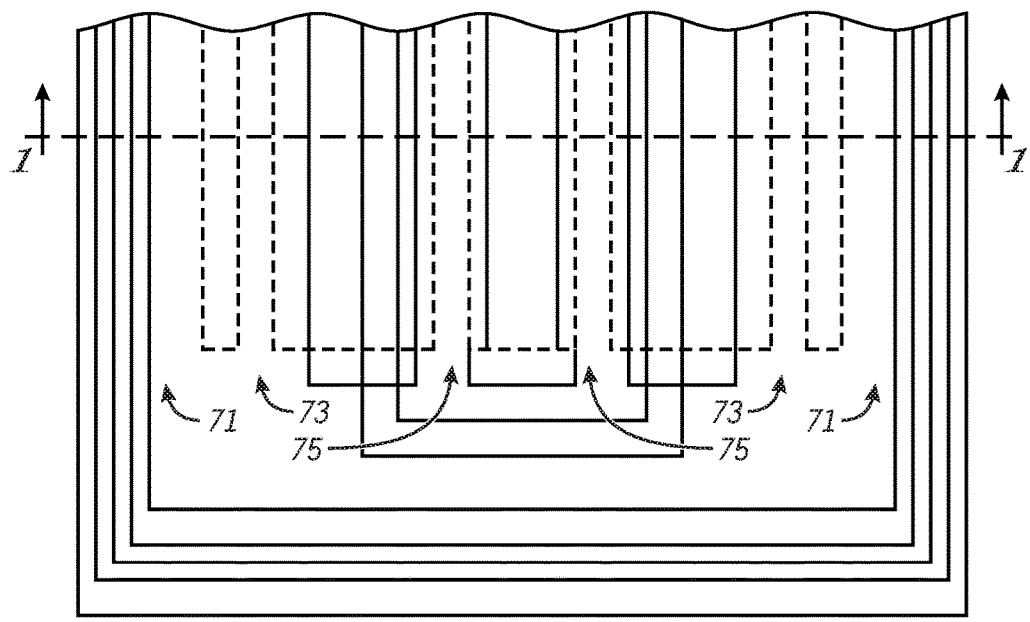
FIG. 3
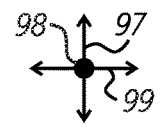
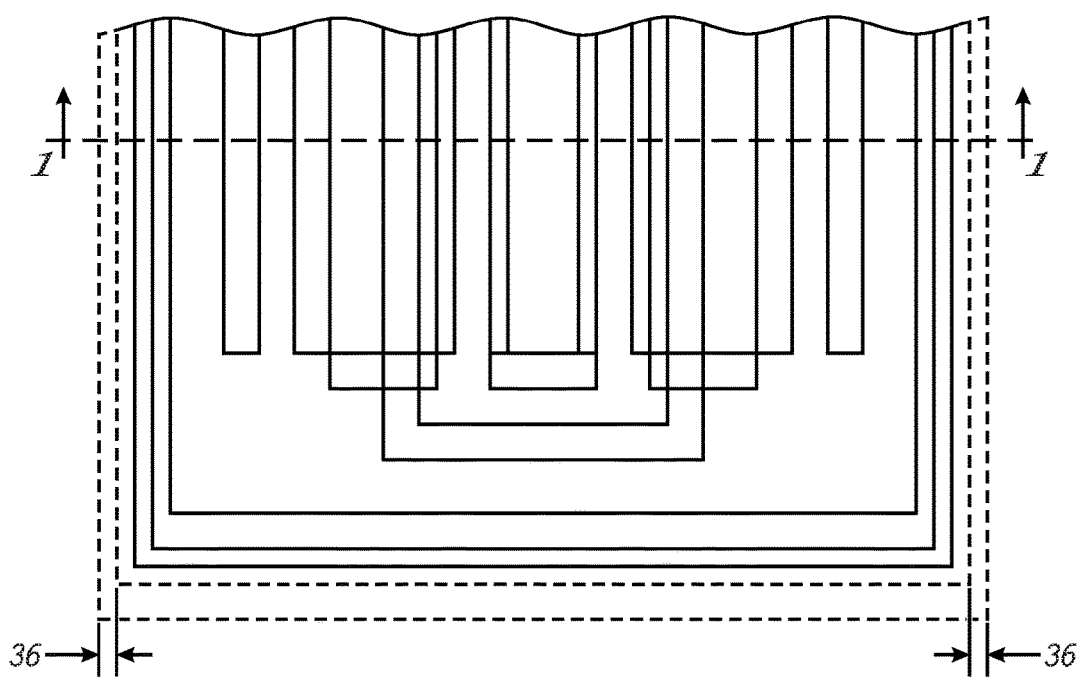
FIG. 4
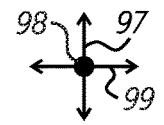

SEMICONDUCTOR DEVICE AND METHOD OF MAKING

FIELD OF THE INVENTION

The present disclosure deals generally with integrated circuit devices, and more particularly to integrated circuits having a shallow trench isolation region between a drain structure and a gate structure.

BACKGROUND OF THE DISCLOSURE

Integrated circuits (ICs) and other electronic devices often include arrangements of interconnected field effect transistors (FETs), also called metal-oxide-semiconductor field effect transistors (MOSFETs), or simply MOS transistors or devices. A typical MOS transistor includes a gate electrode, as a control electrode, and source and drain electrodes, as current electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor is a laterally diffused metal-oxide-semiconductor (LDMOS) transistor. In an LDMOS device, a drift region is provided between the channel region and the drain region to sustain high voltage drop between the transistor source and drain across a relatively long distance.

Various LDMOS devices are designed for different applications. For example, some devices needs to sustain a high voltage drop, thus they are required to possess a high breakdown voltage. On the other hand, current conduction capability might be more crucial in some applications, thus making lowering of the device on-resistance a higher priority.

BRIEF DESCRIPTION OF THE DRAWINGS

The present disclosure may be better understood, and its numerous features and advantages made apparent to those skilled in the art by referencing the accompanying drawings.

FIG. 3 illustrates the particular embodiment of FIG. 1 in plan view highlighting the location of openings in a field isolation region where active silicon is exposed.

FIG. 4 illustrates the particular embodiment of FIG. 1 in plan view highlighting the location where a p-type doped region resides.

The use of the same reference symbols in different drawings indicates similar or identical items.

DETAILED DESCRIPTION OF THE DRAWINGS

According to a particular embodiment of the present disclosure, a LDMOS device is disclosed having a Direct Current (DC) breakdown voltage exceeding 22 volts and a low on-resistance that is typically less than 6.6 mΩ·mm². The device can include a control gate structure, a drain region, a source region, and a shallow trench isolation feature. The control gate is spaced apart from the drain region by a first dimension. The shallow trench isolation region resides in a region between the control gate structure and the drain, which has a common conductivity type as the drain and source. The width of the shallow trench isolation region is much smaller than the first dimension, e.g., no greater than 50% of the first dimension to facilitate a low-on resistance. In response to the drain being biased, an active drift region is formed between the shallow-trench isolation region and the control gate and a field drift region is formed under the shallow-trench isolation region that can extend to near the drain region.

Figure 1:
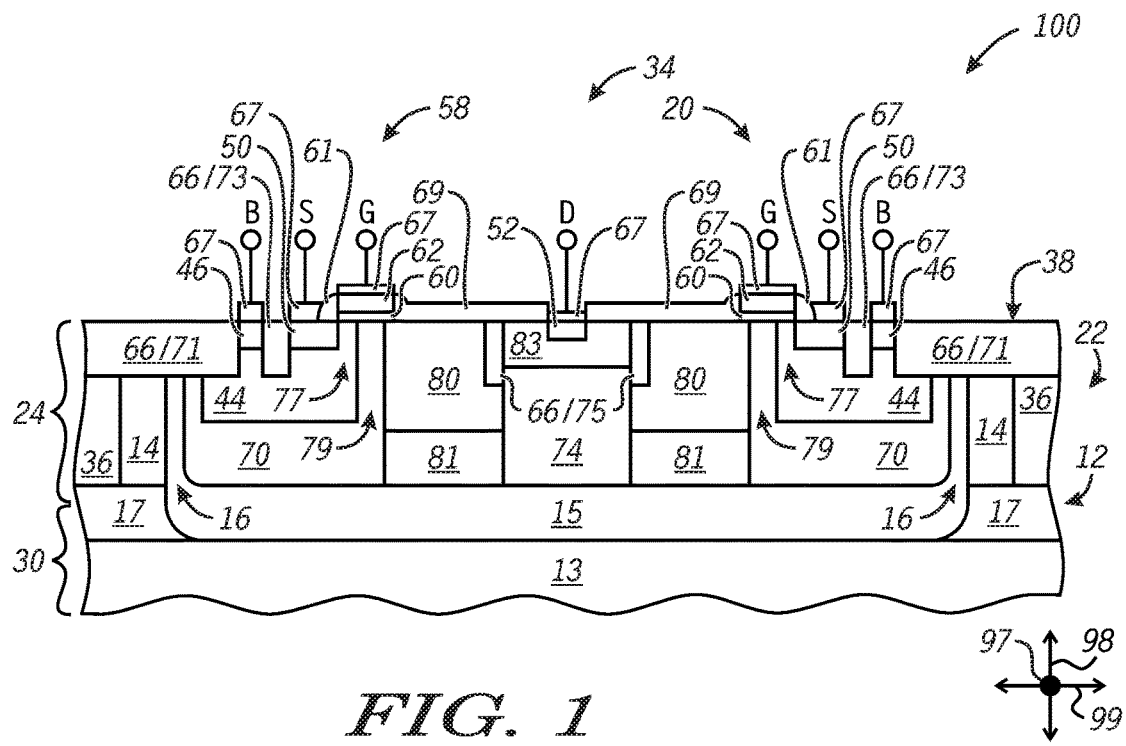
FIG. 1 illustrates a cross-sectional view of a semiconductor device in accordance with a particular embodiment.
Figure 2:
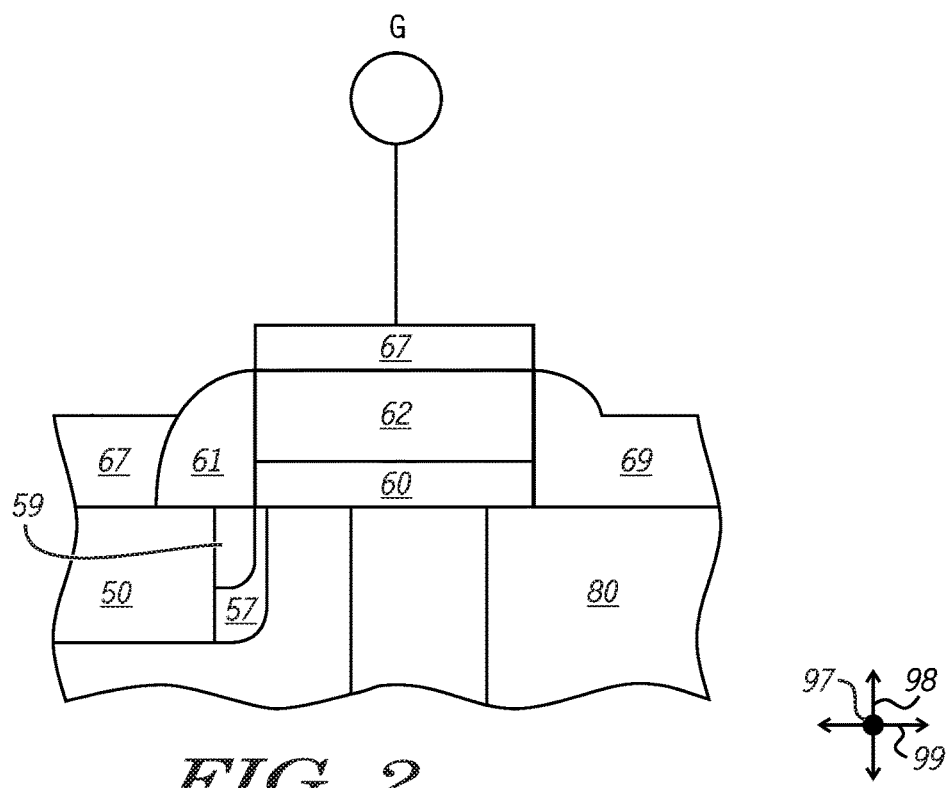
FIG. 2 illustrates a particular portion of the device of claim 1 in greater detail.

In the following figures, FIG. 1 is a schematic cross-sectional view of a device in accordance with a specific embodiment; FIG. 2 is a schematic cross-sectional view of a portion of the device in greater detail; FIGS. 3-13 are plan views illustrating features that correspond to the relative layout locations of various regions of the device of FIG. 1. FIGS. 3-13 each illustrate a common set of features, a portion of which are highlighted by dashed lines when being referenced with respect to a particular figure. It will be appreciated that the various views are intended to be exemplary, and that the actual layout and features of the layout can vary. It will further be appreciated that the order in which FIGS. 3-13 are described herein does not necessarily represent the order in which the various described features are formed. For clarity, directional arrows are included in each figure, wherein arrow 99 indicates a lateral direction, arrow 98 indicates a vertical direction, and arrow 97 indicates a transverse direction, and is represented by a point at the intersection of arrow 99 and arrow 98 by virtue of being perpendicular to the major surfaces of the sheet at which FIG. 1 is printed.

FIG. 1 is a schematic cross-sectional view of a semiconductor substrate 22 having an n-channel LDMOS device 20 constructed at a device area 34. The semiconductor substrate 22 includes a lightly doped p-type bulk substrate 13, at a level 30, having a dopant concentration in the range of $1 \times 10^{14}$ cm$^{-3}$ to $1 \times 10^{16}$ cm$^{-3}$. An n-type buried layer 15 is formed at a region that can include the top surface of bulk substrate 12 to form a junction isolation region between the device area 34 and the portion 13 of bulk substrate below buried layer 15 that remains unmodified. The dopant concentration of the n-type buried layer can be in the range of about $1\times10^{16}$ cm$^{-3}$ to $5\times10^{19}$ cm$^{-3}$. A p-type blanket region 17 is formed at the bulk substrate to further facilitate the junction isolation between the device area 34 and the bulk substrate 12 in a lateral direction around the buried layer 15. It will be appreciated that the various regions described herein can be formed using conventional or proprietary techniques as are known to those skilled in the art. It will also be appreciated by those skilled in the art that the order in which various features are formed can vary.

The semiconductor substrate 22 includes a p-type epitaxial (p-epi) layer grown on the bulk substrate 12 to reside at a level 24. The p-epi layer 24 can have an exemplary thickness in a range from 0.5 µm to 10 µm, and an exemplary dopant concentration in the range of $1\times10^{14}$ cm$^{-3}$ to $1\times10^{16}$ cm$^3$. The p-epi layer can comprise silicon, germanium, other semiconductor materials, and combinations thereof. Regions of the p-epi layer 24 that maintain the original doping of p-epi layer 24 include regions 14, 70 and 79.

A field isolation layer 66, which includes specifically identified features 71, 73, and 75, is formed having a plurality of openings at which active silicon is exposed at the surface 38 of the epitaxial layer 24. The plan view of FIG. 3 illustrates five dashed rectangles, the areas of which indicate the relative location of five exposed active regions of device 20. One skilled in the art will appreciate that field isolation 66 resides at the regions outside of the five dashed rectangles. The relative location of portions 71, 73, and 75 of isolation region 66 as shown at FIG. 1 are also illustrated at FIG. 3. Because the layout of device 20 is symmetric, commonly numbered left and right versions of feature 71-73 are illustrated, each of which will be discussed in greater detail herein.

A ring-shaped p-type region (p-well) region 36 is formed in the epitaxial layer 24. Region 36 may extend through the epitaxial layer 24 to the p-type blanket region 17. Alternatively, it may be separated from the p-type blanket region 17 by a p-epi layer (Not Shown). The relative layout location of the p-well region 36 is indicated at FIG. 4 by the portions of two dashed rectangles, wherein the region between the dashed rectangles represents the region where the ring-shaped p-well region 36 resides. The P-well region 36 has a dopant concentration in the range of $1\times10^{16}$ cm$^3$ to $1\times10^{19}$ cm$^{-3}$.

Figure 5:
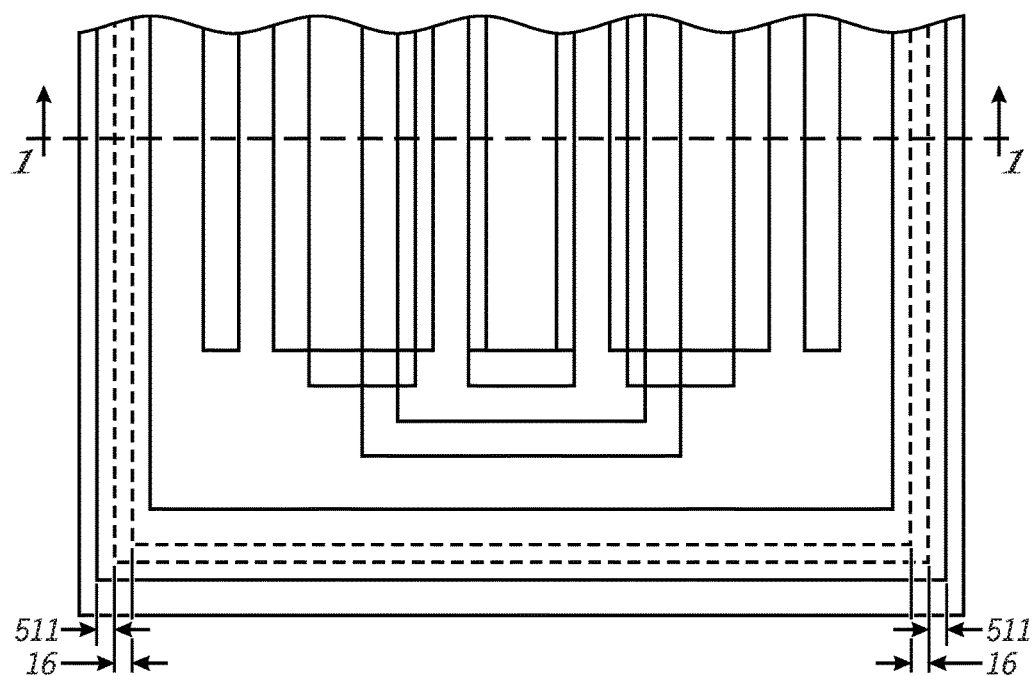
FIG. 5 illustrates the particular embodiment of FIG. 1 in plan view highlighting the location where an n-type isolation ring resides.

Device 20 includes an n-type isolation ring 16 formed by an n-type implant having an exemplary dopant concentration level of about $1\times10^{16}$ cm$^3$ to $1\times10^{19}$ cm$^{-3}$. The isolation ring 16 extends to the buried layer 15, which extends laterally across (e.g., under) the bottom of the active regions of device area 34. The relative layout location of the isolation ring 16 is indicated at FIG. 5 by the portions of two dashed rectangles, wherein the region between the dashed rectangles represents the region where the isolation ring 16 resides. Together, the isolation ring 16 and the buried layer 15 form a junction isolation region that provide electrical isolation of device 20 from outside regions. To achieve a desired breakdown voltage between the device and its vicinity, the isolation ring 16 is spaced apart from the p-well 36 by a portion of the native epitaxial region 14, which is illustrated as distance 511 in FIG. 5.

Figure 6:
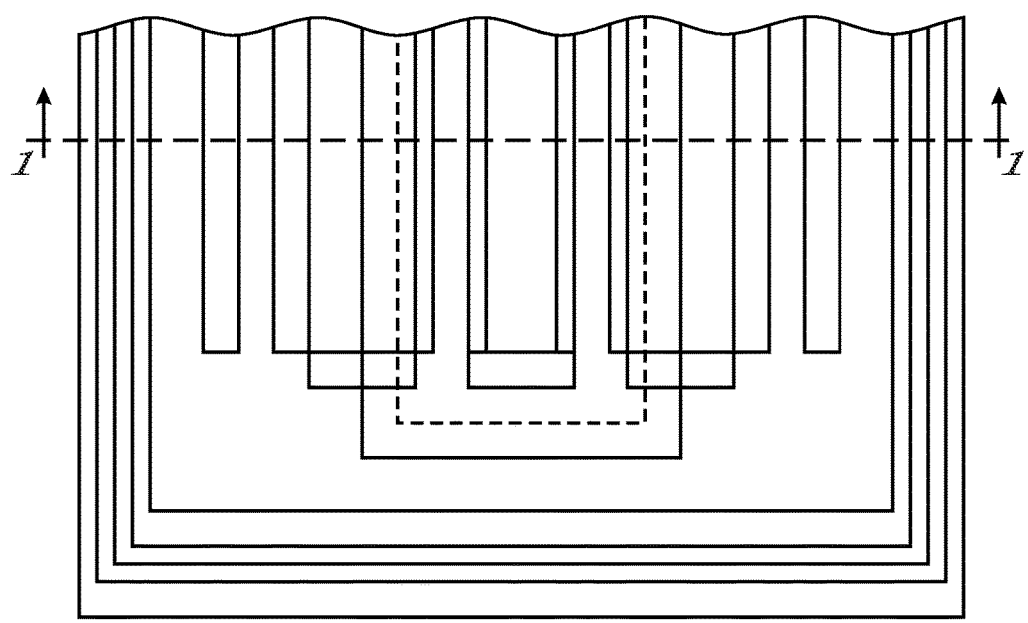
FIG. 6 illustrates the particular embodiment of FIG. 1 in plan view highlighting the location where p-type and n-type implants are performed.

The device 20 includes a high-voltage n-type region 80 (hvnw 80) at an upper portion of the epitaxial level 24, and a p-type region 81 at a lower portion of the epitaxial level 24. Formation of hvnw 80 and p-type region 81 can separate the p-doped epi regions 70/79 from each other in a lateral direction, wherein a p-n interface is formed between the each of the illustrated p-type regions 70/79 and hvnw 80 regions. Alternatively, the p-type region 81 need not abut the buried layer 15, wherein a p-epi layer that connects the p-epi region 70 would reside under the p-type region 81. The hvnw 80 can be a high-voltage well that is configured for high-voltage operation, and can have an exemplary dopant concentration level of about $5\times10^{15}$ cm$^{-3}$ to $5\times10^{18}$ cm$^{-3}$ that can be formed using conventional and proprietary techniques known to those skilled in the art. The p-type region 81 can have an exemplary dopant concentration level that is about $1\times10^{15}$ cm$^{-3}$ to $5\times10^{18}$ cm$^3$ and can be formed using conventional and proprietary techniques known to those skilled in the art. According to an embodiment, the hvnw 80 and the p-type region 81 can be formed as part of a chain implant process. The region of device 20 exposed to the hvnw 80 implant and to the p-type region 81 implant is indicated at FIG. 6 by the dashed rectangle, wherein the area of the dashed rectangle represents the region receiving the implants. Note that other implants within the hvnw 80 region will result in regions having different doping concentrations, see FIG. 1, as will be described in greater detail herein. In other embodiments, the hvnw region 80 and the p-type region 81 could be formed by separate implants using the same or different photomasks.

Figure 7:
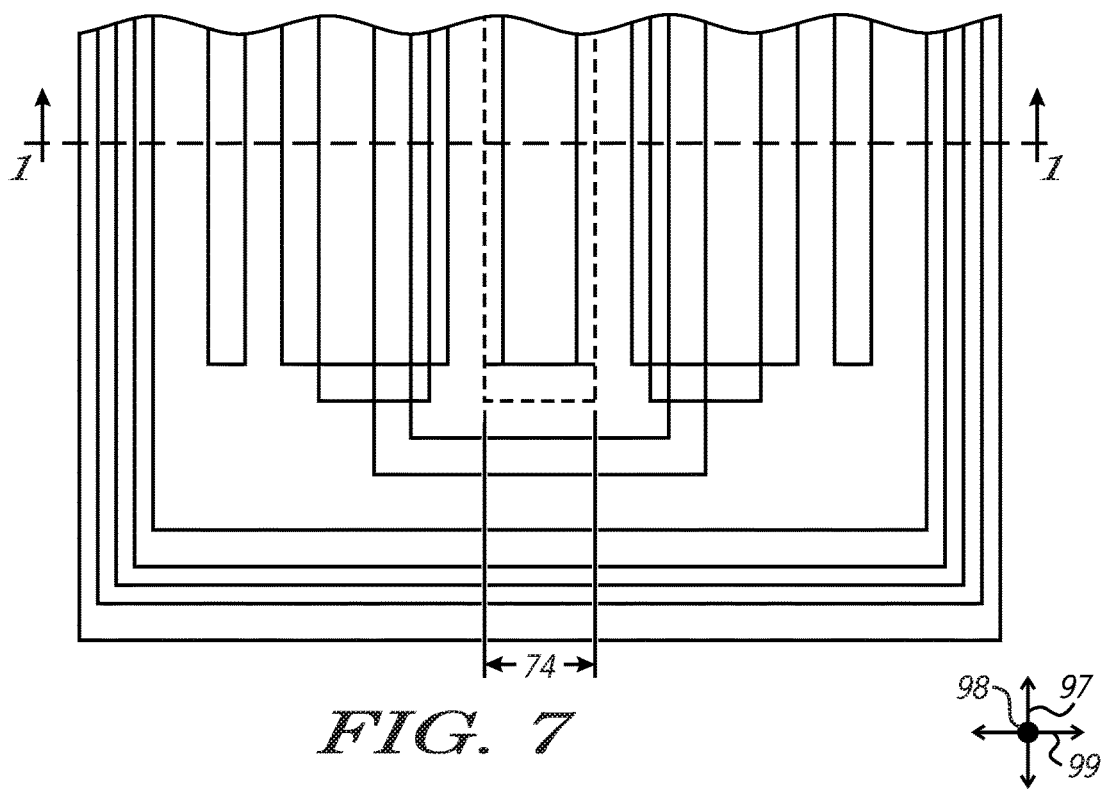
FIG. 7 illustrates the particular embodiment of FIG. 1 in plan view highlighting the location where an n-type doped region of a particular doping concentration resides.

The device 20 includes another n-well region 74 within the region receiving the hvnw 80 implant. The n-well region 74 is centered in the device area 34, and extends below the STI region 66/75 to the buried layer 15. The n-well region 74 has an outer perimeter that abuts the hvnw 80 and the p-type region 81. The n-well region 74 can extend in the direction 97 as shown in the various plan views of FIGS. 3-13. The n-well 74 can have an exemplary dopant concentration level of about $1\times10^{16}$ cm$^{-3}$ to $1\times10^{19}$ cm$^{-3}$ and can be formed using conventional and proprietary techniques known to those skilled in the art. The n-well region 74 and the n-type isolation ring 16 can be formed by the same process steps. The n-well 74 is included to reduce the device's specific on-resistance, but it is optional in this application, wherein, if omitted the region would be a portion of the hvnw 80 and p-type region 81. The relative layout location of n-well region 74 is indicated at FIG. 7 by the dashed rectangle, wherein the area of the dashed rectangle represents the region.

Figure 8:
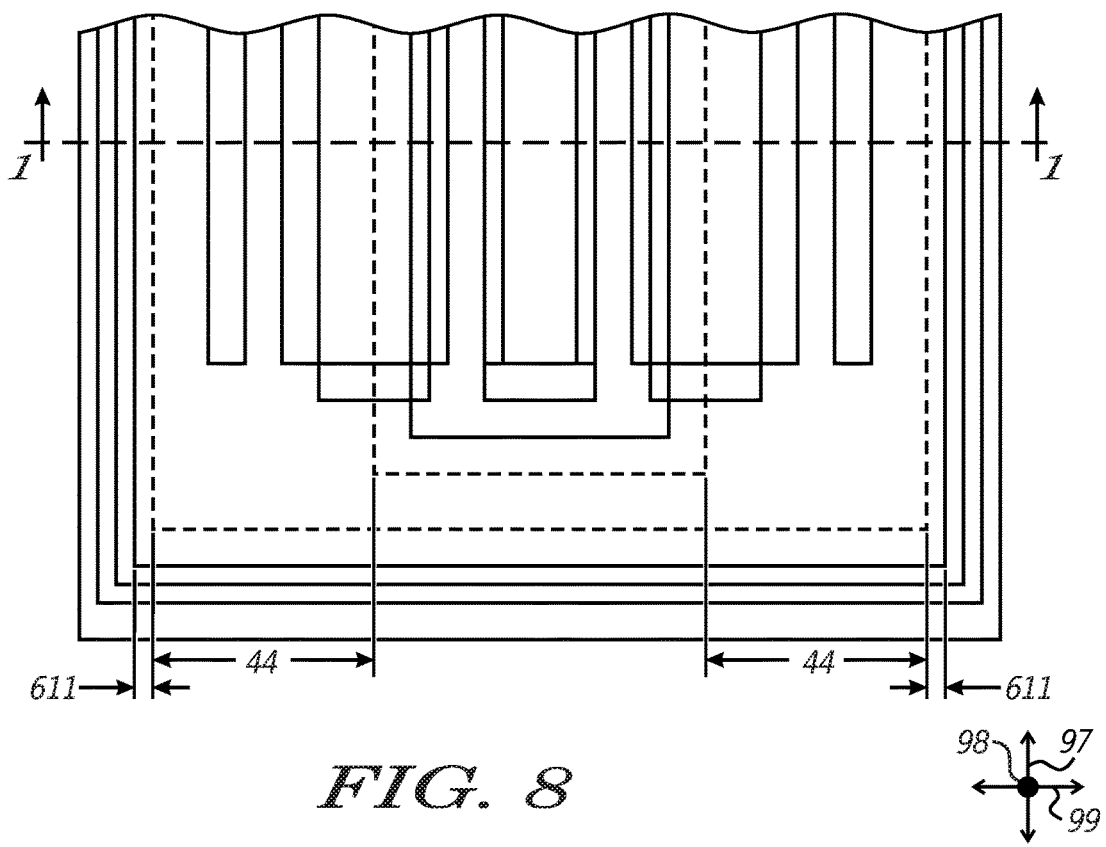
FIG. 8 illustrates the particular embodiment of FIG. 1 in plan view highlighting the location where a p-type doped region of a particular doping concentration resides.

As shown in FIG. 1, device 20 includes high voltage p-type regions 44 (hvpw 44) at the level 24 of semiconductor substrate 22 between the hvnw region 80 and the ring isolation structure 16. Each hvpw 44 can be a high-voltage well that is configured for high-voltage operation. Each hvpw 44 can have an exemplary dopant concentration level of about $1\times10^{16}$ cm$^{-3}$ to $1\times10^{19}$ cm$^{-3}$ and can be formed using conventional and proprietary techniques known to those skilled in the art. Each hvpw 44 is spaced apart in a vertical direction 98 from the buried layer 15 by a distance in the range of about 0 µm to 8 µm. Each hvpw 44 is spaced apart in the lateral direction 99 from hvnw 80 by a distance in the range of about 0 µm to 3 µm. The relative layout location of each hvpw 44 is indicated at FIG. 8 by the two dashed rectangles, wherein the region between the dashed rectangles represents the region where each hvpw 44 resides. As illustrated, Each hvpw 44 is spaced apart from the isolation ring 16 in the lateral direction 99 by a distance 611, which can be in the range of about 0 µm to 3 µm, and is selected based upon a desired breakdown voltage. It will be appreciated, that while the left and right hvpw 44 of FIG. 1 are formed by a single concentric region, defined by concentric rectangles, as illustrated at FIG. 8, in other embodiments each hvpw 44 could be formed by separate left and right rectangular regions, e.g., without the interconnecting regions shown at FIG. 8.

As described previously, an isolation layer 66, also referred to as a Shallow Trench Isolation (STI) layer, is formed in the semiconductor substrate 22 and includes STI regions 71, 73 and 75, as previously described (FIG. 3). The STI regions 71 are formed between the body contact region 46 and substrate contact region (not shown). In FIG. 1, a contact region for isolation ring 15/16 is not shown, but can be formed in device 20 at an opening of the STI regions 71. In an embodiment, STI regions 71 are formed abutting the p-well region 36 in the vertical direction 98, and extend in the lateral direction 99 to a location within the p-body 44 to provide additional isolation. It will be appreciated that the STI region 71 may be omitted, and that alternative isolation schemes can be used.

STI regions 73 are formed to separate the source and body contacts (50 & 46), and can also be omitted. STI regions 75 are formed abutting n-well 74 and the hvnw 80, and are spaced apart from the body region 44, though, as will be discussed below, the location of the STI regions 75 can vary. The depth of the various STI regions 66 (71, 73, & 75) can be the same or different. According to an embodiment, the depth (direction 98) of STI region 75 is in the range of 0.05 μm to 1 μm, and has a length (direction 99) in the range of 0.05 μm to 1 μm. According to an embodiment, the length of STI region 75 is equal to or less than one-half of a dimension that extends in a lateral direction from drain 52 to an edge of conductive layer 62 that is closest to the drain 52, as will be discussed in greater detail below.

Figure 9:
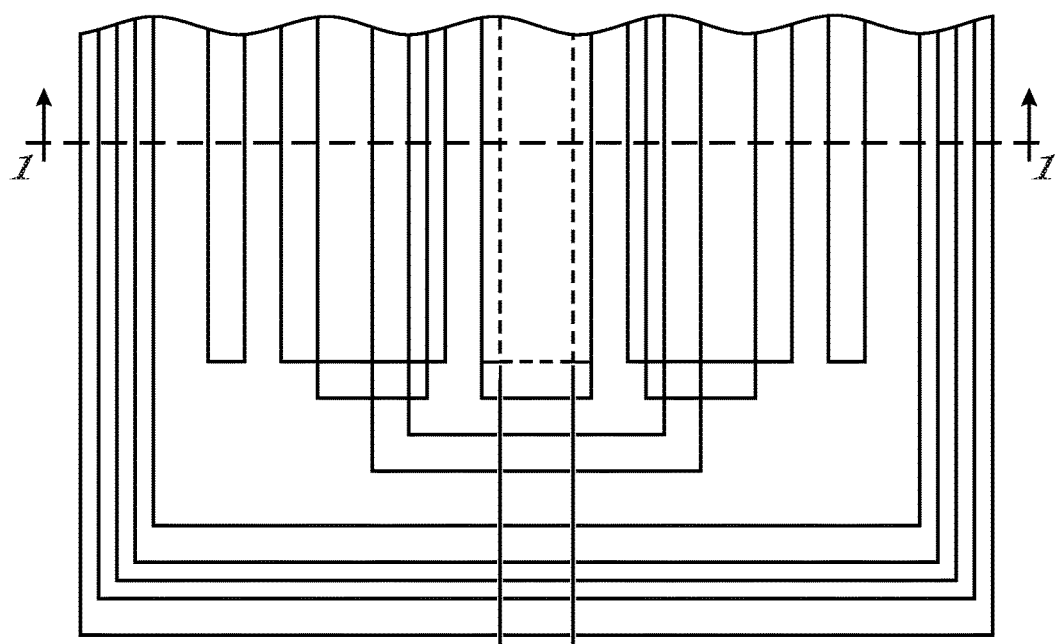
FIG. 9 illustrates the particular embodiment of FIG. 1 in plan view highlighting the location where a drain region resides.

Semiconductor device 20 includes an n-type drain region 52 in the n-well region 74. In the illustrated embodiment, drain region 52 is spaced apart from the STI region 75 by a distance of about 0 μm to 1 μm. Drain region 52 can have an exemplary depth, in the range of 0.05 μm to 0.5 μm, and an exemplary dopant concentration in the range of $1\times10^{19}$ $cm^{-3}$ to $1\times10^{23}$ $cm^{-3}$ sufficient to form ohmic contacts with the drain electrode, labeled "D", and be formed using conventional or proprietary processes as are known to those skilled in the art. In addition, the drain electrode can include a silicide region 67. The depth of the drain region 52 is typically less than the depth of the STI regions 75. The relative layout location the drain region 52 is indicated at FIG. 9 by the dashed rectangle, wherein the area of the dashed rectangle represents the drain region.

Figure 10:
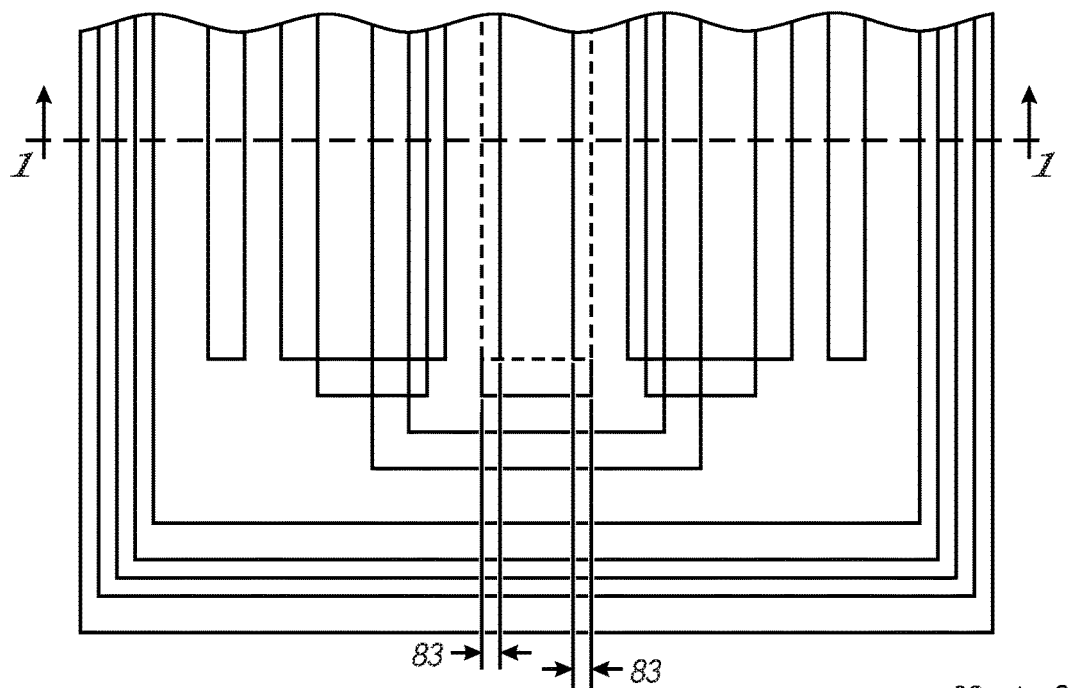
FIG. 10 illustrates the particular embodiment of FIG. 1 in plan view highlighting a location where an n-type doped region of a particular doping concentration resides.

In the embodiment shown in FIG. 1, n-type regions 83 can abut the drain region 52 and the STI regions 75 in a lateral direction, and abut the drain region 52 in a vertical direction. In another embodiment, region 83 abuts hvnw 80 when the STI region 75 is formed within the hvnw 80. In another embodiment, the region 83 extends into some or all of hvnw 80. In another embodiment, region 83 is not formed. The n-type region 83 has a thickness that is greater than the thickness of the drain region 52, and can have an exemplary thickness in the range of about 0.05 μm to 1.5 μm. The n-type region 83 can have an exemplary dopant concentration in the range of about $1\times10^{16}$ $cm^{-3}$ to $1\times10^{19}$ $cm^{-3}$, and can be formed using conventional or proprietary processes as are known to those skilled in the art. It will be appreciated that the relative layout location of region 83 is shown at FIG. 10 by the dashed rectangles, and that the implant used to form the n-type region 83 can extend into the adjacent STI regions, assuming the implant is not deep enough to penetrate the STI. It will be appreciated that the entire drain is also exposed to the implant that forms n-type region 83.

Figure 11:
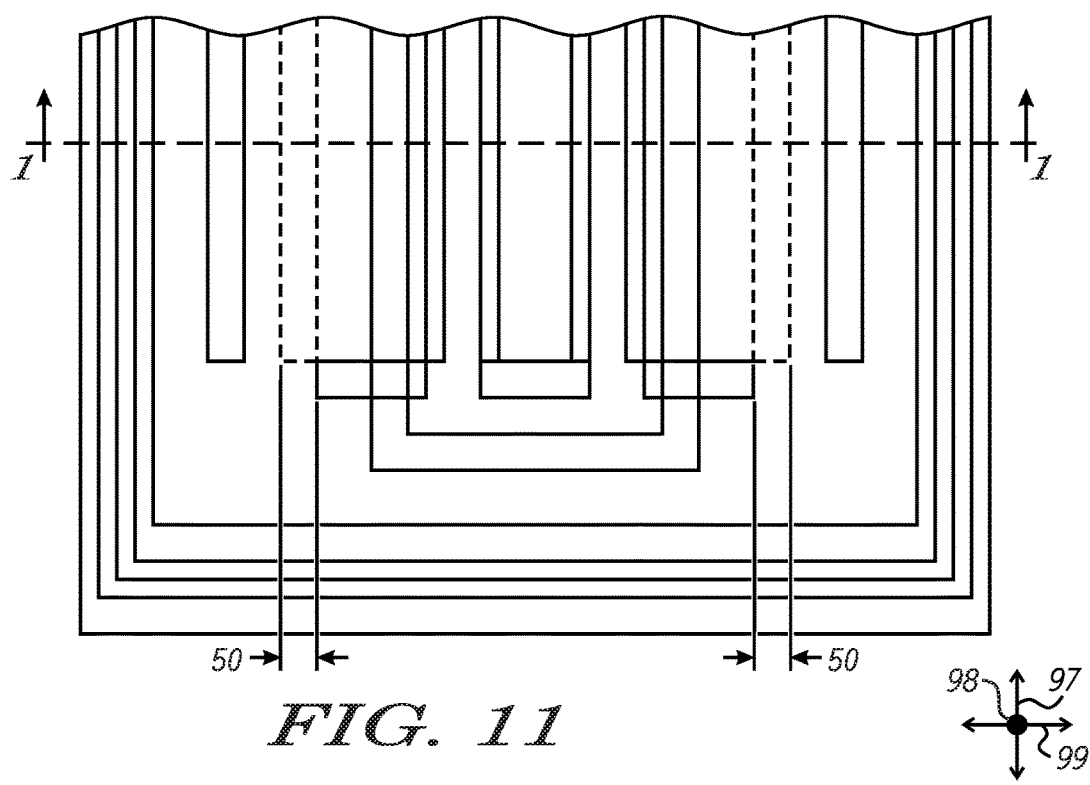
FIG. 11 illustrates the particular embodiment of FIG. 1 in plan view highlighting a location where source regions reside.

N-type source regions 50 reside in the left and right p-type body regions 44; and, as illustrated, have outer sidewalls abutting the STI regions 73 and inner sidewalls that can be aligned to the conductive structure 62 of corresponding gates. As mentioned previously, in an alternate embodiment, the STI region 73 can be omitted, wherein the source region 50 would be contiguous with the body contact region 46. The source region 50 can have an exemplary depth (direction 98) in the range of about 0.05 μm to 0.5 μm, an exemplary length (direction 99) in the range of 0.1 μm to 1.0 μm, and an exemplary dopant concentration in the range of about $1\times10^{19}$ $cm^{-3}$ to $1\times10^{23}$ $cm^{-3}$ that is sufficient to form ohmic contacts with the source electrode, labeled "S". As illustrated in FIG. 2, the p-type body region 44 can include a p-type halo region 57 and a lightly doped drain (LDD) region 59. The halo region 57 can have a doping concentration in the range of about $1\times10^{18}$ $cm^{-3}$ to $1\times10^{20}$ $cm^{-3}$. The LDD region 59 can have a doping concentration in the range of about $1\times10^{17}$ $cm^{-3}$ to $1\times10^{19}$ $cm^{-3}$, and can be spaced apart from the well region 80 in the lateral direction by a distance in the range of about 0.1 μm to 3.0 μm. The source region 50, the halo region 57, and the lightly-doped source region 59 can be formed using conventional or proprietary processes as are known to those skilled in the art. The relative layout location of source regions 50 is indicated at FIG. 11 by the dashed rectangles, wherein the area of the dashed rectangles represent source regions.

Figure 12:
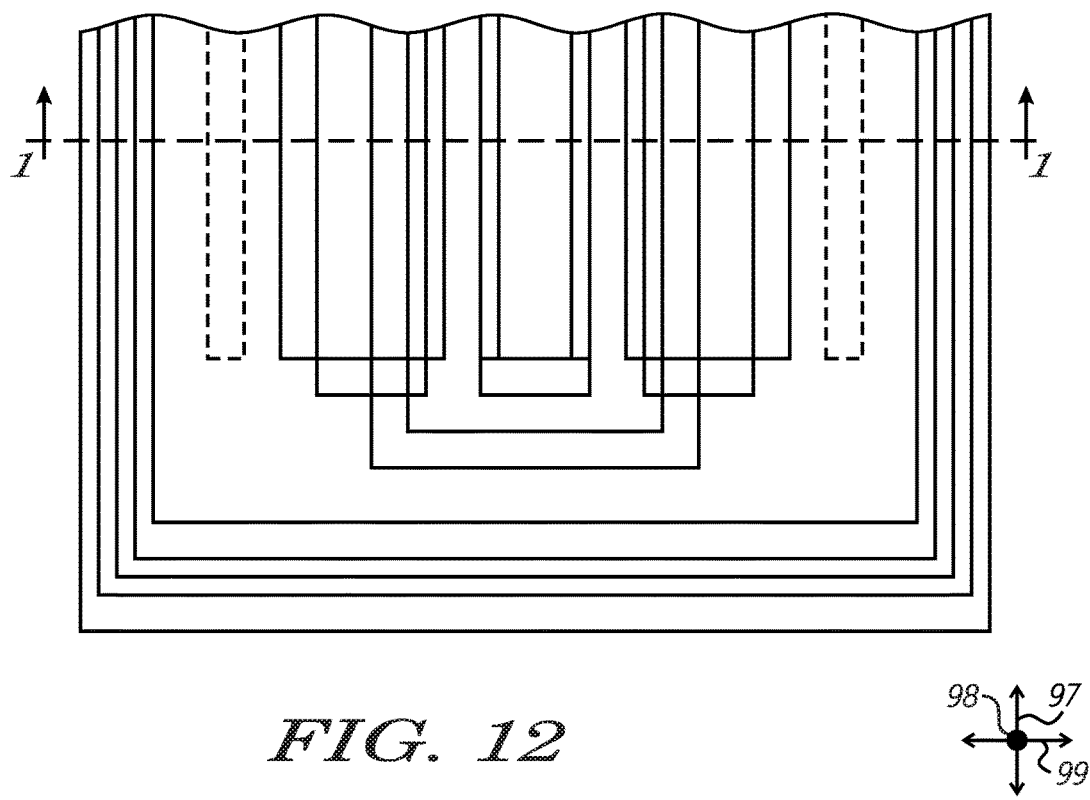
FIG. 12 illustrates the particular embodiment of FIG. 1 in plan view highlighting the location where body contacts reside.

Body contact regions 46 resides in the p-type body 44, and have outer sidewalls abutting the STI region 71 and inner sidewalls abutting STI region 73. An exemplary dopant concentration of body contact region 46 is in the range of about $1\times10^{19}$ $cm^{-3}$ to $1\times10^{23}$ $cm^{-3}$, and is sufficient to form ohmic contacts with the body region 44, and with an electrode, labeled "B". The body contact regions can be formed using conventional or proprietary processes as are known to those skilled in the art. As described above, in another embodiment, the body contact regions 46 are contiguous with the source region 50. The relative layout location the body contact regions 46 is indicated at FIG. 12 by the dashed rectangles.

Figure 13:
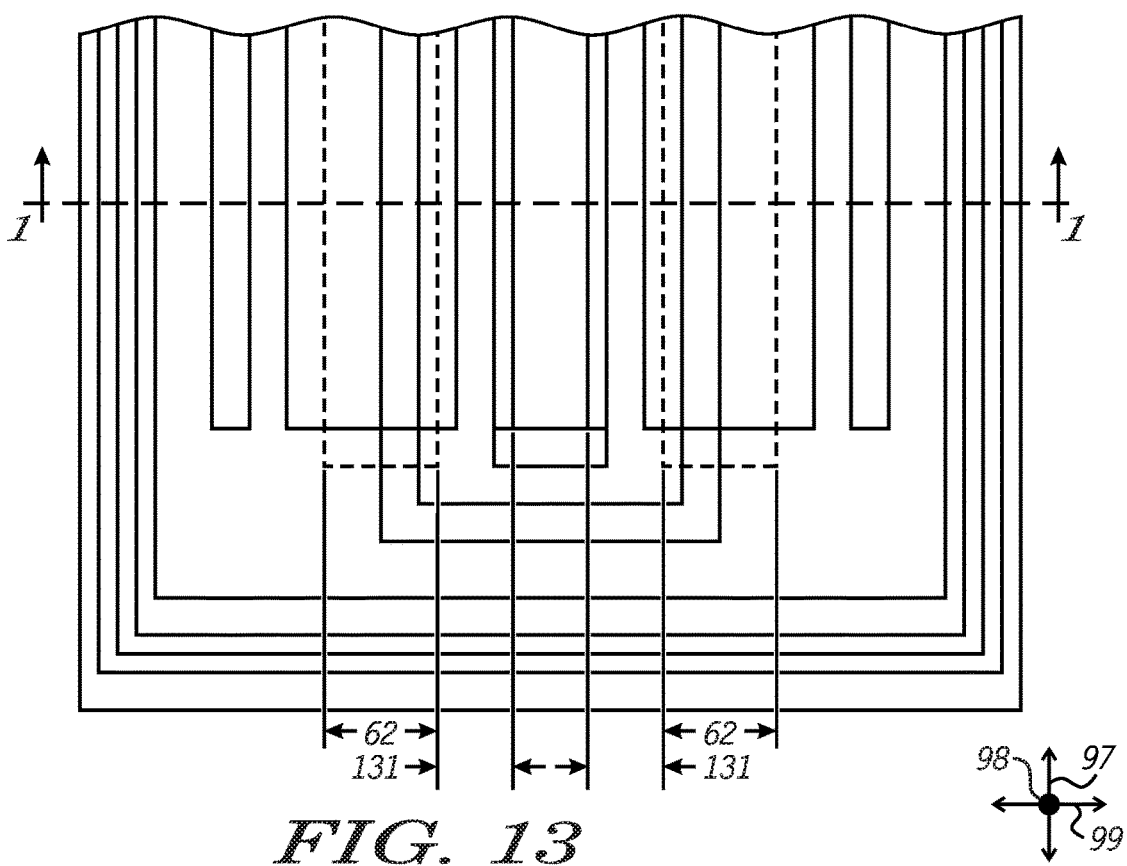
FIG. 13 illustrates the particular embodiment of FIG. 1 in plan view highlighting the location where conductive layers of gate structures resides.

Gate structures 58 of the semiconductor device 20 is formed over the surface 38, and includes a conductive layer 62, a gate dielectric 60 and a sidewall spacer 61. In the present embodiment, it is presumed that gate structure 58 include two separate gates having a common width (direction 97). The sidewall spacer 61 overlies the source region 50, and the conductive layer 62 overlies the halo region 57. The gate structure can have a length (direction 99) in the range of about 0.1 μm to 3.0 μm. A portion of each gate structure's conductive layer 62 can extend laterally into the hvnw region 80 by a distance in the range of about 0.05 μm to 1.5 μm. The relative layout location of the conductive layer 62 of the gate structures 58 is indicated at FIG. 13 by the dashed rectangles. Also illustrated at FIG. 13 is the lateral dimension 131 from the conductive layer 62 to the drain region 52, which can be in the range of 0.1 μm to 3.0 μm.

An insulator region over the surface 38 includes insulator portions 61 and 69. Insulator portion 61 is a sidewall spacer of the gate structure 58 overlying the source region 50. Insulator portion 69 extends in a lateral direction from the drain region 52 to the edge of the conductive layer 62. The insulator region 69 can include a portion that covers the vertical edge of conductive layer 62. In an alternate embodiment, an insulator portion can partially overlie the conductive layer 62 by a certain distance, e.g., cover a top portion of the gate structure 58 under which the conductive layer 62 resides. The insulator region 69 can be used as a silicide blocker during a silicide process that forms silicide regions 67 at the body contacts 46, the source regions 50, the conductive gate structures 58, and the drain 52. Each of the silicide regions 67 can be considered part of a terminal providing an electrical interface to its respective active structure.

Device 20 is configured so that when the gate structure 58 is biased with a high potential, the channel regions 77 and the p-type epitaxial region 79 under the conductive layer 62 are inverted into n-type regions, allowing charge carriers to flow from the source region 50 toward the drain region 52 through regions 77, 79, 80, 74 and 83 when the drain is applied to a high voltage. In particular, device 20 is configured so that an accumulation region is constructed under conductive layer 62 in the hvnw region 80 so that a drift region is formed that includes an active drift region in the hvnw region 80 between STI region 75 and the conductive layer 62 of gate structure 58, and a field drift region is formed in the hvnw region 80 under the STI region 75. In an embodiment where the STI region 75 is more centered within the hvnw region 80 (closer to the gate than illustrated), some or all of the region between the STI region 75 and the n-well region 74 can be depleted and sustain a certain voltage drop when the drain is biased with a high potential. Charges carriers also transport through this region when they flow from the source to the drain during on-state operation. Therefore, during on-state operation, charge carriers transport from the channel region 77 to the drain 52 through the accumulation region under the conductive gate 62, the active drift region under the insulator 69, the field drift region under the STI region 75, the hvnw region 80 between the STI region 75 and the n-well region 74 (if any), the n-well region 74, and the n-type regions 83.

According to an embodiment, a ratio between the length of the STI region 75 and distance 131 in FIG. 13 (the distance between the conductive gate layer 62 and the drain region 52) is in the range of 0.50 to 0.05. Thus, the length of the STI region 75 is no greater than one-half of the distance between the conductive gate layer 62 and the drain region 52.

The length of the STI region 75 in the lateral direction can be the minimum STI width allowed by a particular technology, or a width larger than the minimum allowed STI width. According to various embodiments, the length of the STI region 75 can be less than 1.0 µm, less than 0.8 µm, less than 0.6 µm, less than 0.4 µm, or less than 0.2 µm. The position of STI region 75 can be adjusted to meet different requirements. For example, when the STI region 75 moves closer to the drain region 52, a lower on-resistance is obtained at expense of a low breakdown voltage. Conversely, the breakdown voltage of device 20 increases as the STI region 75 is placed nearer the gate structure 58. However, this configuration also brings about a higher on-resistance. Similarly, the length of STI region 75 can be adjusted to change the on-resistance and the breakdown voltage of the device, wherein as the length of the STI region 75 increases so does the on-resistance and the breakdown voltage.

The drift region of hvnw can be configured for depletion during operation to reduce the magnitude of the electric field in accordance with the reduced surface field (RESURF) effect to provide improved breakdown performance. For example, when a voltage is biased between the drain to source (Vds), one or more PN junctions form between the n-type regions (e.g., hvnw 80) and the p-type regions (e.g., the p-type epitaxial regions 70/79 and the buried p-type region 81) to establish a RESURF effect directed to decreasing the electric field in the drift region. It will be appreciated that the drift region may be depleted both laterally and vertically, at least in part, during off-state operation. A decreased electric field may increase the breakdown voltage (BVdss) of the device 20.

The drain region can be further configured to further achieve a low on resistance (Rdson) based upon the dopant concentrations and dimensions of the n-well region 74 and the heavily doped n-type regions 83. For example, when the n-type regions 83 are thicker, e.g., extend further below the drain region 52, the Rdson will decrease.

Figure 14:
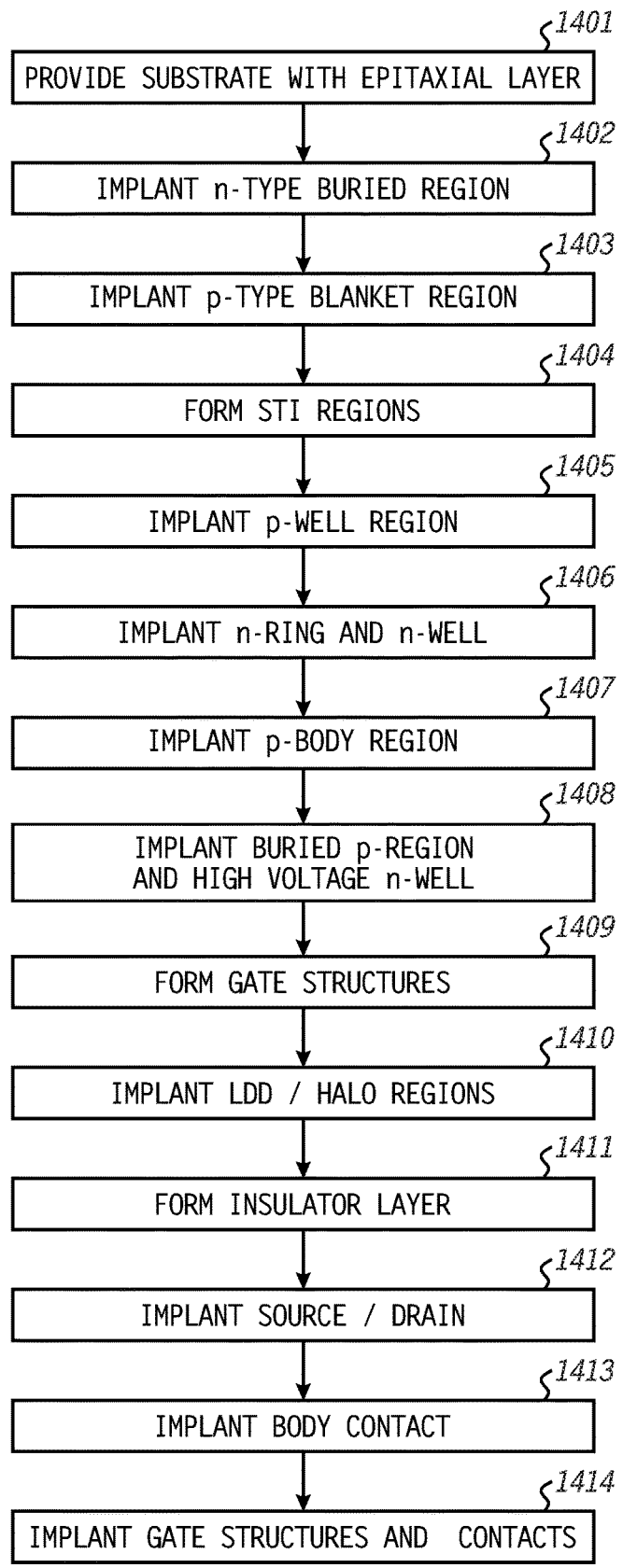
FIG. 14 illustrates a particular embodiment of a manufacturing flow for manufacturing the device of FIG. 1.

FIG. 14 illustrates a flow diagram that indicates an exemplary manufacturing flow for device 20. At block 1401, a substrate is provided that can include the bulk substrate and an overlying epitaxial layer of a common conductivity type, e.g. p-doped. At block 1402, a buried region, such as region 15 of FIG. 1, can be formed by implanting a dopant having the opposite conductivity type, e.g., n-doped, as the epitaxial region. At block 1403, a blanket region, such as region 17, can be formed by implanting a dopant having the same conductivity type as the epitaxial region. At block 1404, the STI regions are formed. At block 1405, a region, such as region 36, can be formed by implanting a dopant having the same conductivity type as the epitaxial layer. At block 1406, a region, such as region 16 and region 74, can be formed by implanting a dopant having the opposite conductivity type as the epitaxial layer. At block 1407, a body region, such as region 44, can be formed by implanting a dopant having the same conductivity type as the epitaxial layer. At block 1408, a buried p-type region and a high voltage n-well region can be formed by implementing a chain implant process that results in a region, such as region 81, being doped with a dopant of the same conductivity type as the epitaxial layer, and another region, such as region 80, being doped with a dopant of the opposite conductivity type as the epitaxial layer. At block 1409, the gate structures are formed. At block 1410 implants are performed to form the LDD and Halo regions, such as regions 59 and 57. At block 1411, the silicide block layers are formed. At block 1412, source/drain regions implants are performed using a dopant of the opposite conductivity type as the epitaxial region to form source/drain regions 50 and 52. At block 1413, body contacts, such as region 46, can be formed by implanting a dopant having the same conductivity type as the epitaxial layer. At block 1414, various other structures are formed to form a completed integrated circuit die that includes the various features described herein. It will be appreciated that the order of the particular flow is exemplary, and that the processing blocks could be performed in an alternate order.

While the invention has been described above by reference to various embodiments, it should be understood that many variations may be made without departing from the scope of the invention. It is therefore intended that the foregoing detailed description be regarded as illustrative rather than limiting, and that it be understood that it is the following claims, including all equivalents, that are intended to define the spirit and scope of this invention. For example, while device has been described as being an n-type device, it will be understood that a p-type device can also be formed by forming regions of opposite conductivity type than those described.

Also, the specific embodiment disclosed above has been implemented as either a rectangular or ring-shaped structure. For example, when device 20 is implemented as a rectangular structure the gate structure 58 represent two distinct gates that are parallel to each other, the drain region is a rectangular shaped drain that is common to each of the two distinct gates, and the source regions 50 are two distinct regions, each associated with one of the two gates. When device 20 is implemented as a ring-shaped structure, the gate structure 58 can be a single ring-shaped structure, the drain region 52 remains a rectangular region, and the source region 50 is a ring-shaped region. In addition, it will be appreciated that in other embodiments, the device 20 can have multiple drains accompanied by additional gate and source regions. Also, it will be appreciated that devices can be formed having multiple drain regions and additional source regions and gate regions, wherein the features between each gate and its corresponding source are similar to that described herein.

It will be appreciated that various features can be added or omitted. The fact that some features have been explicitly identified as being able to be omitted does not mean all other described features are required, unless explicitly stated. Also, it will be appreciated that various features can be modified. For example, the buried layer 15 can be formed after the epi layer at level 24, and can reside in portions of both the epi-layer and the bulk substrate. While the present embodiment uses a bulk substrate, it will be appreciated that similar layout can be achieved on a silicon-on-insulator (SOI) substrate.

What is claimed is:

1. A semiconductor device comprising:
a first region of a first conductivity type, the first region comprising a drain region;
a second region of a second conductivity type that is opposite the first conductivity type abutting the first region in a lateral direction to form an interface between the first conductivity type and the second conductivity type, the drain region spaced apart from the interface;
a source region of the first conductivity type abutting the second region in the lateral direction and a vertical direction;
a control gate structure comprising a conductive layer, the conductive layer being spaced apart from the drain region by a first dimension in the lateral direction; and
a shallow trench isolation (STI) region having a second dimension in the lateral direction is disposed at a location of the first region between the source region and the drain region, the second dimension being equal to or less than one-half of the first dimension, and there are no other STI regions disposed between the source region and the drain region that abut the first region.

2. The semiconductor device of claim 1, wherein the STI region is disposed between the conductive gate and the drain region.

3. The semiconductor device of claim 1, wherein the interface is positioned in the lateral direction between first and second edges of the conductive layer.

4. The semiconductor device of claim 1, wherein the source region is aligned to a first edge of the conductive layer that is furthest from the drain region in the lateral direction.

5. The semiconductor device of claim 1 further comprising an insulator layer starting at the control gate structure and ending at a silicide disposed at the drain region.

6. A semiconductor device comprising:
a first region of a first conductivity type, the first region comprising a drain region;
a second region of a second conductivity type that is opposite the first conductivity type abutting the first region in a lateral direction to form an interface between the first conductivity type and the second conductivity type, the drain region spaced apart from the interface;
a source region of the first conductivity type abutting the second region in the lateral direction and a vertical direction;
a control gate structure comprising a conductive layer, the conductive layer being spaced apart from the drain region by a first dimension in the lateral direction; and
a shallow trench isolation (STI) region having a second dimension in the lateral direction is disposed at a location of the first region between the source region and the drain region, the second dimension being equal to or less than one-half of the first dimension, and there are no other STI regions disposed between the source region and the drain region that abut the first region, wherein the dimension of the STI region along the first lateral direction is less than one micro-meter.

7. A semiconductor device comprising:
a first region of a first conductivity type, the first region comprising a drain region;
a second region of a second conductivity type that is opposite the first conductivity type abutting the first region in a lateral direction to form an interface between the first conductivity type and the second conductivity type, the drain region spaced apart from the interface;
a source region of the first conductivity type abutting the second region in the lateral direction and a vertical direction;
a control gate structure comprising a conductive layer, the conductive layer being spaced apart from the drain region by a first dimension in the lateral direction; and
a shallow trench isolation (STI) region having a second dimension in the lateral direction is disposed at a location of the first region between the source region and the drain region, the second dimension being equal to or less than one-half of the first dimension, and there are no other STI regions disposed between the source region and the drain region that abut the first region, wherein the second region includes a well region having a first dopant concentration that abuts the source region, and a third region that abuts the well region and the first region in the lateral direction and has a second dopant concentration that is less than the first dopant concentration, wherein the well region is spaced apart from the first region by the third region.

8. A semiconductor device comprising:
a first region of a first conductivity type, the first region comprising a drain region;
a second region of a second conductivity type that is opposite the first conductivity type abutting the first region in a lateral direction to form an interface between the first conductivity type and the second conductivity type, the drain region spaced apart from the interface;
a source region of the first conductivity type abutting the second region in the lateral direction and a vertical direction;
a control gate structure comprising a conductive layer, the conductive layer being spaced apart from the drain region by a first dimension in the lateral direction; and
a shallow trench isolation (STI) region having a second dimension in the lateral direction is disposed at a location of the first region between the source region and the drain region, the second dimension being equal to or less than one-half of the first dimension, and there are no other STI regions disposed between the source region and the drain region that abut the first region, wherein the first region further comprises a third region, having a first dopant concentration, that abuts the drain region in the lateral direction.

9. The semiconductor device of claim 8, wherein the third region extends further in the vertical direction than does the drain region.

\* \* \* \* \*